United States Patent
Kim et al.

(10) Patent No.: US 10,553,514 B2
(45) Date of Patent: Feb. 4, 2020

(54) SUBSTRATE STRIP INCLUDING CONDUCTIVE PLANE AROUND PERIPHERY OF CHIP MOUNTING REGIONS AND METHOD OF MANUFACTURING SEMICONDUCTOR PACKAGE USING THE SAME

(71) Applicants: Keung Beum Kim, Hwaseong-si (KR); Wonchul Lim, Asan-si (KR); Dongsuk Kim, Hwaseong-si (KR); Yonghoon Kim, Suwon-si (KR)

(72) Inventors: Keung Beum Kim, Hwaseong-si (KR); Wonchul Lim, Asan-si (KR); Dongsuk Kim, Hwaseong-si (KR); Yonghoon Kim, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/972,341

(22) Filed: Dec. 17, 2015

(65) Prior Publication Data
US 2016/0181195 A1 Jun. 23, 2016

(30) Foreign Application Priority Data
Dec. 19, 2014 (KR) .................. 10-2014-0184869

(51) Int. Cl.
*H01L 23/495* (2006.01)
*H01L 23/48* (2006.01)
(Continued)

(52) U.S. Cl.
CPC .... *H01L 23/3121* (2013.01); *H01L 23/49827* (2013.01)

(58) Field of Classification Search
CPC ............... H01L 23/3121; H01L 23/60; H01L 23/49838; H01L 23/49816; H01L 21/561; H01L 23/3128; H01L 23/145; H01L 2224/81005; H01L 2224/97; H01L 2924/15311; H01L 2224/16227; H01L 23/49827; H01L 23/49833; H01L 23/49861; H01L 23/3735; H01L 23/49527; H01L 23/49534; H01L 23/29; H01L 23/3164; H01L 31/0781; H01L 31/0488; H01L 33/56
(Continued)

(56) References Cited

U.S. PATENT DOCUMENTS 5,970,321 A 10/1999 Hively
6,078,068 A 6/2000 Tamura
(Continued)

*Primary Examiner* — Kimberly N Rizkallah
*Assistant Examiner* — Dilinh P Nguyen
(74) *Attorney, Agent, or Firm* — Volentine, Whitt & Francos, PLLC

(57) ABSTRACT

A substrate includes a substrate body including a plurality of chip mounting regions and a peripheral region surrounding the plurality of chip mounting regions, each of the chip mounting regions including a conductive plane. The substrate further includes a conductive support structure located in the peripheral region, first conductive lines connected between the conductive planes of adjacent chip mounting regions, and second conductive lines connected between the conductive support structure and the conductive planes of chip mounting regions located adjacent the peripheral region.

5 Claims, 23 Drawing Sheets

(51) Int. Cl.
*H01L 23/52* (2006.01)
*H01L 23/31* (2006.01)
*H01L 23/498* (2006.01)

(58) Field of Classification Search
USPC ........ 257/668, 700, 778, 774; 361/719, 761, 361/764
See application file for complete search history.

(56) References Cited

U.S. PATENT DOCUMENTS

| | | | |
|---|---|---|---|
| 6,144,542 | A | 11/2000 | Ker et al. |
| 6,160,705 | A * | 12/2000 | Stearns ............. H01L 23/49816 174/252 |
| 6,849,479 | B2 * | 2/2005 | Wu ........................ H01L 23/60 438/108 |
| 7,649,723 | B2 | 1/2010 | Chiu et al. |
| 8,194,373 | B2 | 6/2012 | Padden |
| 8,372,729 | B1 | 2/2013 | Cheng et al. |
| 8,427,797 | B2 * | 4/2013 | Charlon ................ H01L 23/585 361/118 |
| 8,482,890 | B2 | 7/2013 | Kim et al. |
| 2001/0008309 | A1 * | 7/2001 | Iijima ............... H01L 21/76885 257/737 |
| 2006/0186536 | A1 * | 8/2006 | Hsu ........................ H01L 23/36 257/720 |
| 2008/0150159 | A1 * | 6/2008 | Aberin .................. H01L 21/563 257/778 |
| 2009/0190277 | A1 | 7/2009 | Hiew et al. |
| 2010/0309602 | A1 | 12/2010 | Chien |
| 2011/0140247 | A1 * | 6/2011 | Pagaila ............... H01L 23/3128 257/659 |
| 2012/0182650 | A1 | 7/2012 | Chi |
| 2014/0124729 | A1 * | 5/2014 | Hwang .................. H01L 45/06 257/5 |

* cited by examiner

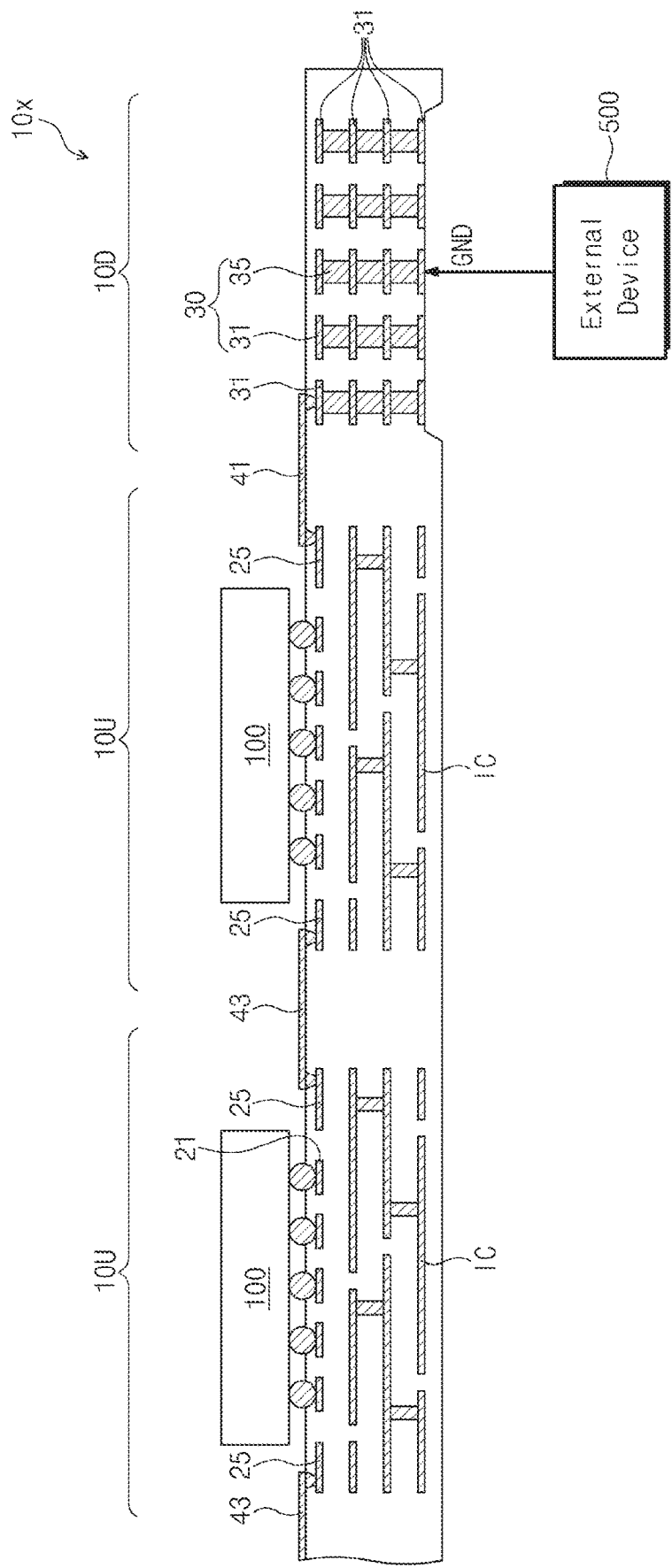

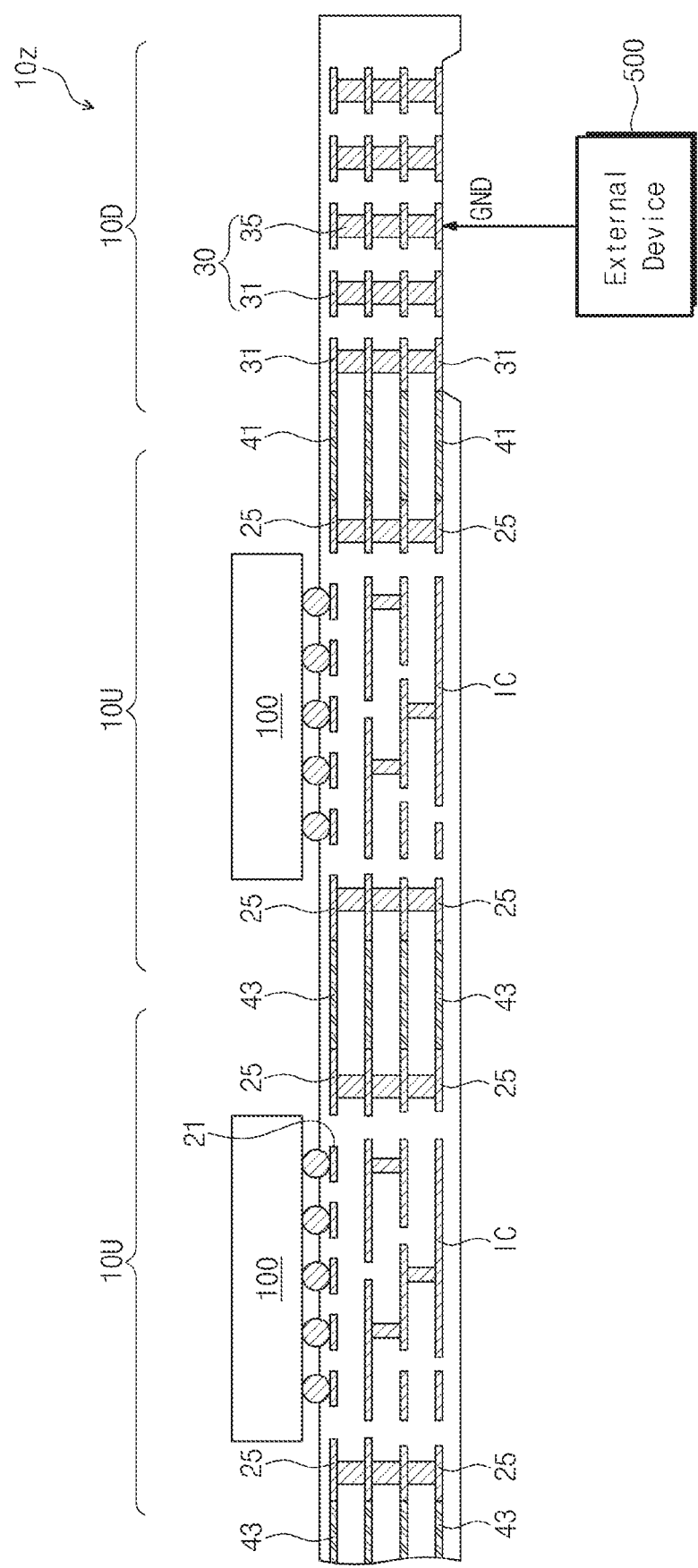

SUBSTRATE STRIP INCLUDING CONDUCTIVE PLANE AROUND PERIPHERY OF CHIP MOUNTING REGIONS AND METHOD OF MANUFACTURING SEMICONDUCTOR PACKAGE USING THE SAME

CROSS-REFERENCE TO RELATED APPLICATION

A claim of priority under 35 U.S.C. § 119 is made to Korean Patent Application No. 10-2014-0184869, filed Dec. 19, 2014, in the Korean Intellectual Property Office, the disclosure of which is hereby incorporated by reference in its entirety.

BACKGROUND

Embodiments of the inventive concepts generally relate to a substrate strip, to a semiconductor package fabricated from a substrate strip, and to a method of fabricating a semiconductor package from a substrate strip.

The increased integration of semiconductor circuits continues with the development of semiconductor manufacturing techniques. As a result, the size of elements contained within the semiconductor circuits has been reduced, which can result in the elements becoming more susceptible during manufacture to damage caused by electrostatic discharge and the like.

SUMMARY

In one aspect, a substrate is provided which includes a substrate body including a plurality of chip mounting regions and a peripheral region surrounding the plurality of chip mounting regions, each of the chip mounting regions including a conductive plane. The substrate further includes a conductive support structure located in the peripheral region, first conductive lines connected between the conductive planes of adjacent chip mounting regions, and second conductive lines connected between the conductive support structure and the conductive planes of chip mounting regions located adjacent the peripheral region.

The conductive plane of each chip mounting region may be a ground terminal that surrounds a periphery of each chip mounting region.

The first and second conductive lines may be co-planar with the conductive planes.

The conductive support structure may include a plurality of dummy pad terminals, and a plurality of interconnection lines electrically connecting the dummy pad terminals to each other. The dummy pad terminals may be arranged in a matrix pattern.

The conductive support structure may include plural dummy pad terminal stacks, each of the dummy pad terminal stacks including vertically aligned dummy pad terminals electrically connected by conductive vias, and a plurality of interconnection lines electrically connecting the dummy pad terminal stacks to each other.

The dummy pad terminal stacks may be arranged in a matrix pattern.

The chip mounting regions may be located on an upper surface of the substrate body, and at least one of the dummy pad terminal stacks may be electrically exposed at a bottom surface of the substrate body.

The chip mounting regions may be located on an upper surface of the substrate body, and the first and second conductive lines may extend along the upper surface of the substrate body. The substrate may further include first vias connecting the first conductive lines to the conductive planes of adjacent chip mounting regions, and second vias connecting the second conductive lines to the conductive support structure and the conductive planes of chip mounting regions located adjacent the peripheral region.

The chip mounting regions may be located on an upper surface of the substrate body, and the first and second conductive lines may extend below the upper surface of the substrate body in a same plane as at least one of the dummy pad terminals.

The substrate may further include a semiconductor chip mounted in each chip mounting region.

In another aspect, a semiconductor package is provided which includes a substrate having opposite first and second surfaces, a conductive plane on the first surface of the substrate, and a plurality of conductive lines each having a proximate end connected to the conductive plane and each having a distal end flush with a side surface of the substrate.

The conductive lines may extend normal the outer edge of first surface of the substrate.

The conductive plane may be a ground terminal that extends around a periphery region of the first surface of the substrate. The conductive plane may be contiguous around an entirety of the periphery region of the substrate.

At least one of the plurality of conductive lines may be located at each of plural outer edges of the first surface of the substrate.

The proximate end of each of the plurality of conductive lines may overlap the conductive plane and be connected to the conductive plane by a via.

The conductive lines and the conductive plane may be co-planar. The proximate end of each of the plurality of conductive lines may be contiguous with the conductive plane.

The conductive plane may include a stack of vertically aligned conductive planes having vias connected there between.

In yet another aspect, a semiconductor package is provided which includes a substrate having an upper surface, a lower surface, and a plurality of side surfaces, a conductive plane extending around a periphery of the substrate adjacent the side surfaces of the substrate, and a plurality of conductive lines each having a proximate end connected to the conductive plane and a distal end flush with one of the side surfaces of the substrate. The semiconductor package further includes a semiconductor chip mounted on the upper surface of the substrate, an encapsulate covering an upper surface of the substrate and the semiconductor chip, and terminal connections located on a lower surface of the substrate and electrically connected to the semiconductor chip.

The plurality of conductive lines may be located at the upper surface of the substrate.

The plurality of conductive lines may be embedded within the substrate below the upper surface of the substrate.

Side surfaces of the encapsulate may be flush with the side surfaces of the substrate, respectively.

The proximate end of each of the conductive lines may be connected to the conductive plane by a respective via.

The proximate end of each of the conductive lines may be co-planar with the conductive plane. The conductive lines may be contiguous with the conductive plane at the proximate end of each of the conductive lines.

The conductive plane may be included in a stack of conductive planes vertically spaced and aligned below the upper surface of the substrate. Each of the conductive lines may be included in one of plural stacks of conductive lines connected to and co-planer with the stack of conductive planes, respectively. The semiconductor package further includes vias connecting the stack of conductive planes to each other.

BRIEF DESCRIPTION OF THE DRAWINGS

The inventive concepts will become readily apparent from the detailed description that follows with reference to the accompanying drawings, throughout which like reference numerals refer to like or similar elements, and in which:

FIGS. 8A, 8B, and 8C are cross-sectional views illustrating portions of substrate strips according to example embodiments of the inventive concepts;

DETAILED DESCRIPTION

Figure 1A:
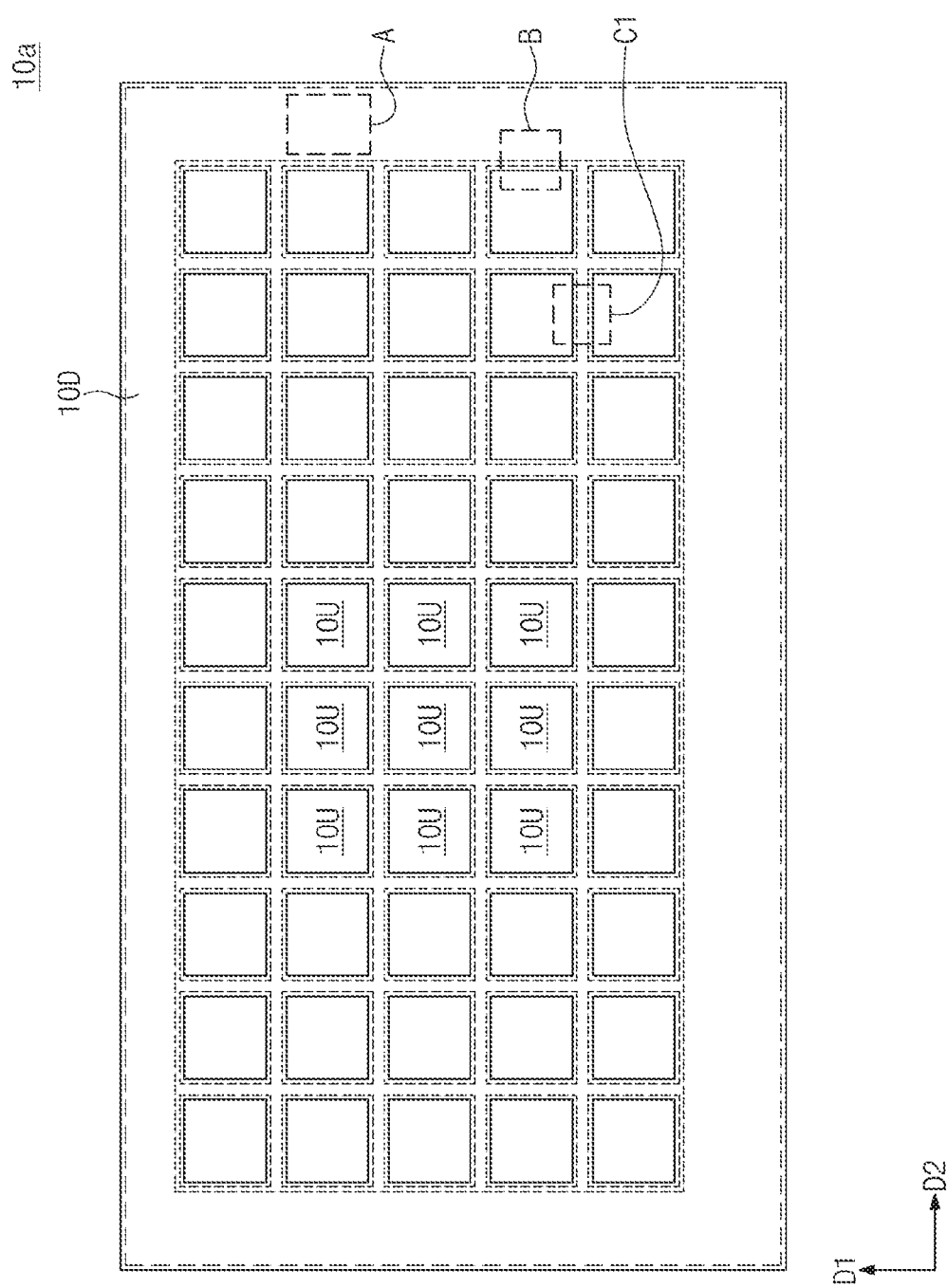
FIGS. 1A and 1B are schematic plan views illustrating substrate strips according to example embodiments of the inventive concepts.

The inventive concepts will now be described more fully hereinafter with reference to the accompanying drawings, in which exemplary embodiments of the inventive concepts are shown. The advantages and features of the inventive concepts and methods of achieving them will be apparent from the following exemplary embodiments that will be described in more detail with reference to the accompanying drawings. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts. In the drawings, embodiments of the inventive concepts are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concepts. Accordingly, shapes of the exemplary views may be modified according to manufacturing techniques and/or allowable errors. Therefore, the embodiments of the inventive concepts are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concepts explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Figure 1B:
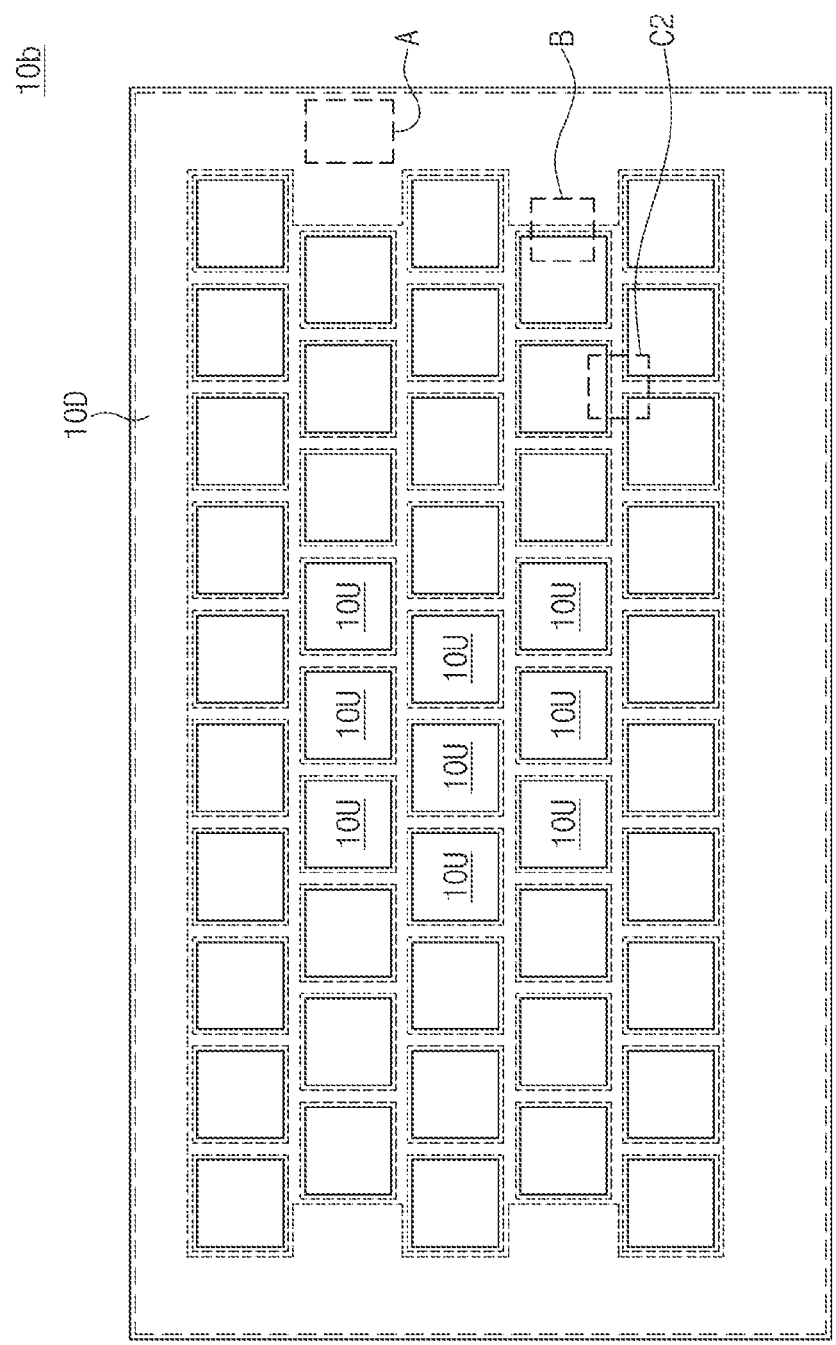

FIGS. 1A and 1B are schematic plan views illustrating respective substrates 10a and 10b that may be used in the fabrication of semiconductor packages according to example embodiments of the inventive concepts. In examples of these embodiments, the substrates are referred to as substrate strips.

The substrate strips 10a and 10b of FIGS. 1A and 1B may, for example, be printed circuit boards having circuit patterns. As examples, a substrate body of the substrate strips 10a and 10b may be composed of a resin, a photosensitive liquid dielectric, a photosensitive dry-film dielectric, a polyimide flexible film, a thermally cured dry film, a thermally cured liquid dielectric, a resin-coated copper foil (RCC), a thermoplastic, or a flexible resin. As another example and in other embodiments, the substrate body of the substrate strips 10a and 10b may be composed of ceramic.

According to example embodiments, the substrate strips 10a and 10b include a plurality of unit regions 10U and a dummy region 10D. A semiconductor chip 100 may be mounted in each of the unit regions 10U, and the dummy region 10D may occupy a peripheral region surrounding the unit regions 10U. The unit regions 10U may be arrayed along a surface of the substrate body of the substrate strips 10a and 10b in a first direction D1 and a second direction D2 perpendicular to the first direction D1. In the illustrated embodiments, an upper surface of the substrate strips 10a and 10b is rectangular, and the number of the unit regions 10U arranged along the first direction D1 is different than the number of the unit regions 10U arranged along the second direction D2. However, the inventive concepts are not limited in this respect. Also in the illustrated embodiments, the unit regions 10U are arranged at regular intervals. That is, a distance between the unit regions 10U in the first direction D1 is substantially equal to a distance between the unit regions 10U in the second direction D2. Again, however, the inventive concepts are not limited in this respect.

As illustrated by the embodiment of FIG. 1A, the unit regions 10U of each row may be aligned with those of adjacent rows to define a regular matrix pattern. Alternatively, as illustrated by the embodiment of FIG. 1B, each row (in the direction D2) of unit regions 10U may be offset relative adjacent rows of unit regions 10U to define an irregular matrix pattern. In this case, each column (in the direction D1) of the unit regions 10U may be described as forming a zigzag. It is noted, however, that the inventive concepts are not limited by the example arrangements of unit regions 10U shown in FIGS. 1A and 1B.

In other embodiments, the dummy region 10D may also be disposed between groups of unit regions 10U. In this case, each group of unit regions 10U would include plural unit regions 10U that are separated from each other group of units regions 10U by the dummy region 10D.

As will be explained in greater detail later herein, a dummy structure may be formed in the dummy region 10D. The dummy structure may provided structural support and may be formed simultaneously with circuit patterns of the unit regions 10U. In addition, although not shown in the drawings, the dummy region 10D may include other features such an alignment hole, a slot, and/or an alignment mark. The alignment hole may be used as a datum point when processes are performed on the substrate strips 10a and 10b, and the slot may minimize or prevent warpage of the substrate strips 10a and 10b.

Figure 2A:
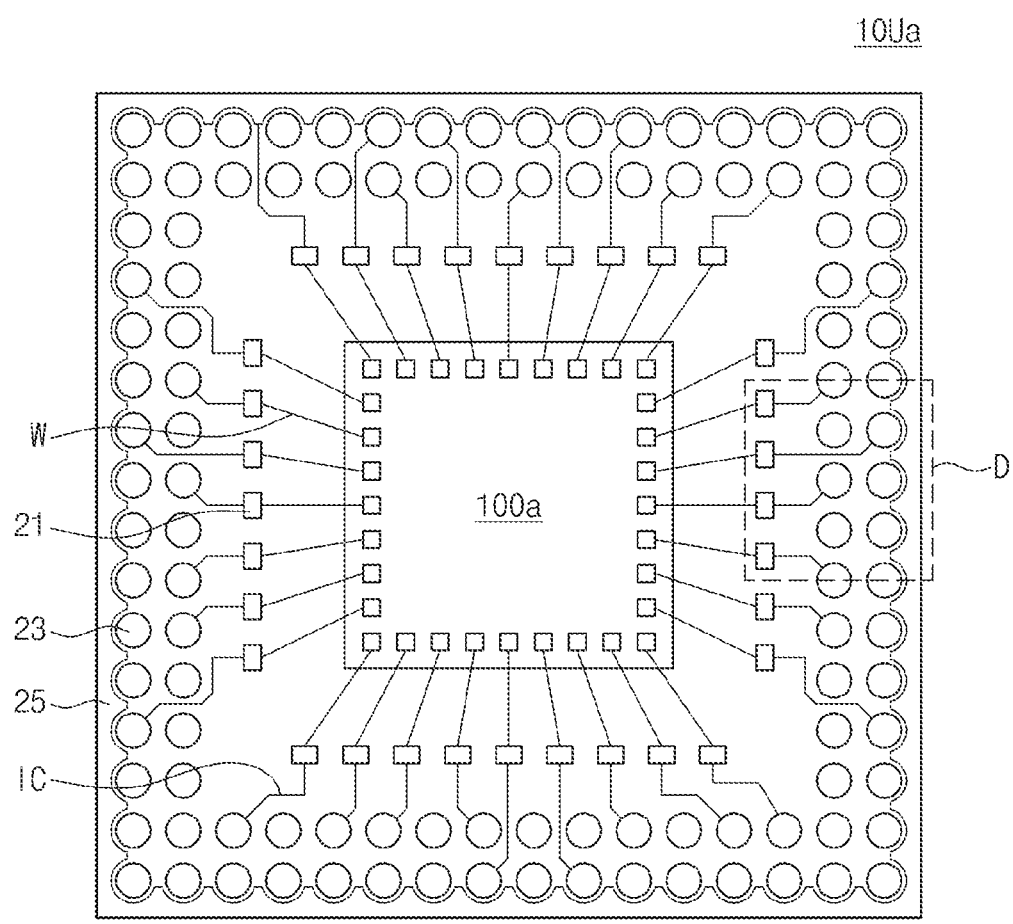
FIGS. 2A and 2B are plan views illustrating unit regions of substrate strips according to example embodiments of the inventive concepts.
Figure 2B:
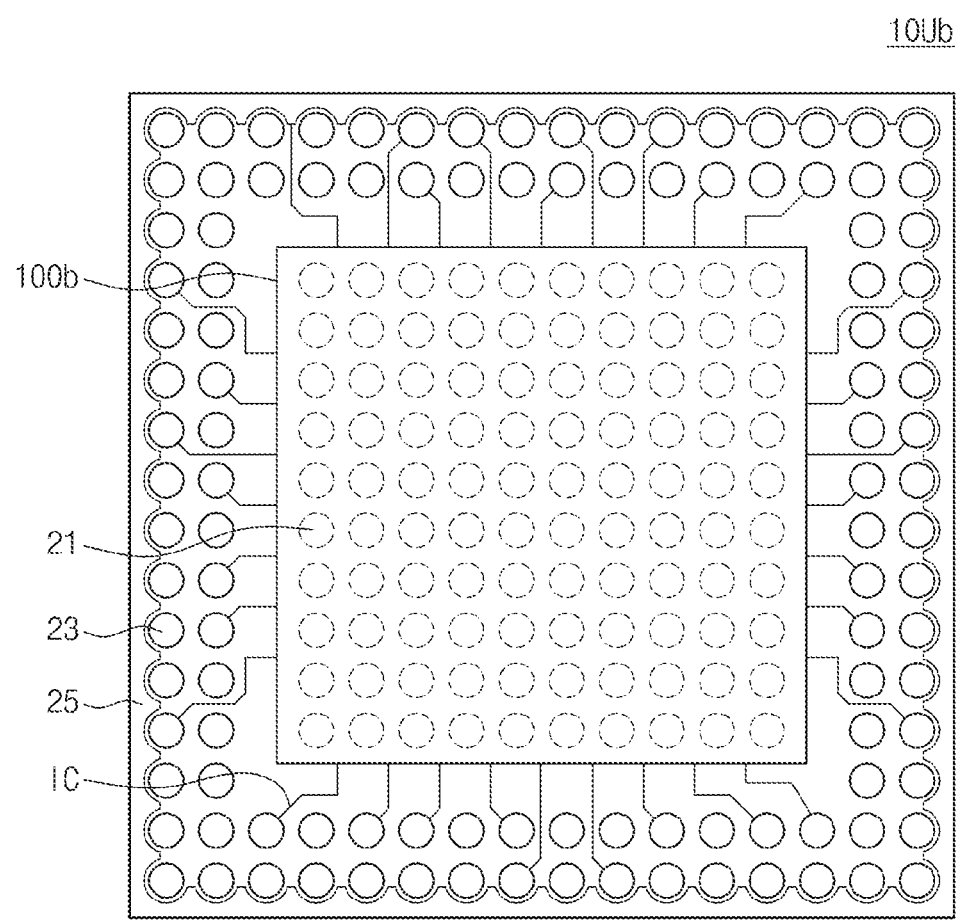
Figure 3:
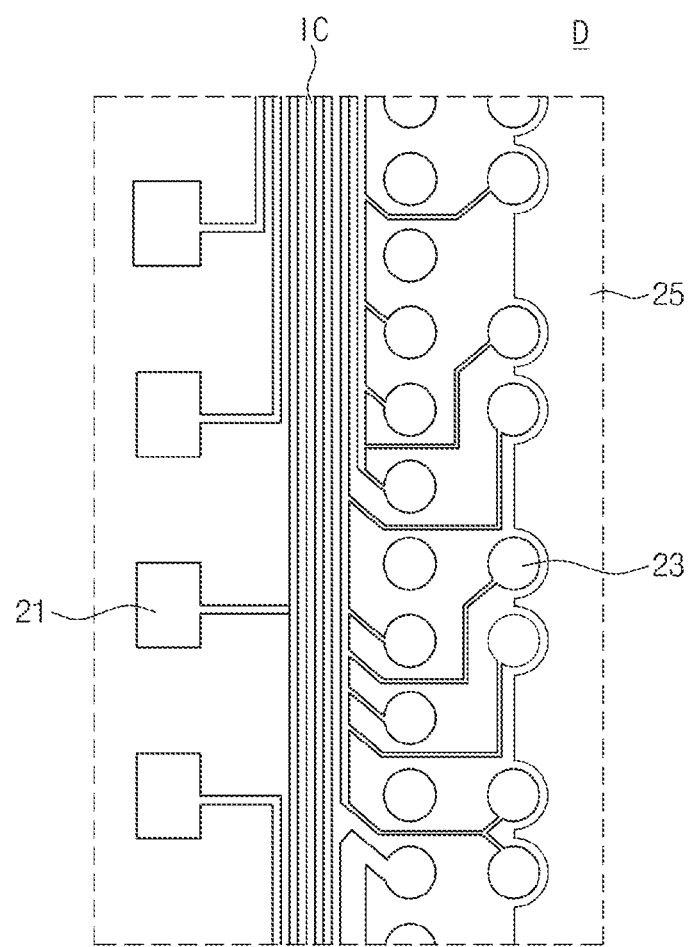
FIG. 3 is an enlarged view of a portion 'D' of FIG. 2A according to an embodiment of the inventive concepts.

FIGS. 2A and 2B are plan views illustrating unit regions 10Ua and 10Ub of substrate strips according to respective example embodiments of the inventive concepts. FIG. 3 is an enlarged view of a portion 'D' of FIG. 2A.

Referring to FIGS. 2A and 2B, the unit regions 10Ua and 10Ub may include bonding pads 21, inner interconnections IC, input/output (I/O) pads 23, a power terminal (not labeled), and a ground terminal 25. The semiconductor chip 100a or 100b may be mounted on a central portion of the unit regions 10Ua and 10Ub, respectively. Although the inventive concept is no so limited, a surface occupation area of the semiconductor chip 100a or 100b may be equal to or greater than about 50% of a surface area of the unit region 10U.

In the example illustrated in FIG. 2A, the bonding pads 21 are disposed around the semiconductor chip 100a on a top surface of the unit region 10Ua, and pads of the semiconductor chip 100 are electrically connected to the bonding pads 21 through bonding wires W. The I/O pads 23 are spaced from and electrically connected to the bonding pads 21, and may be may be disposed on a bottom surface or a top surface of the unit region 10Ua. In particular, the I/O pads 23 may be electrically connected to the bonding pads 21 through the inner interconnections IC.

In contrast, in the example illustrated in FIG. 2B, the semiconductor chip 100b is mounted on the unit region 10Ub in a flip-chip bonding configuration. In this case, the bonding pads 21 may be disposed in a central portion of the unit region 10Ub, and pads of the semiconductor chip 100b may be bonded to the bonding pads 21 through conductive bumps or the like. The I/O pads 23 are spaced from and electrically connected to the bonding pads 21, and may be may be disposed on a bottom surface or a top surface of the unit region 10Ub. In particular, the I/O pads 23 may be electrically connected to the bonding pads 21 through the inner interconnections IC.

Referring to FIGS. 2A, 2B, and 3, the ground terminal 25 may be disposed on the unit region 10Ua or 10Ub to surround the semiconductor chip 100a or 100b. In the example of these embodiments, the ground terminal 25 is a conductive plane. Also in the example of these embodiments, the ground terminal 25 is contiguous around an entire periphery of the unit region 10Ua or 10Ub to define closed-loop surrounding the semiconductor chip 100a or 100b. Also in the example of these embodiments, the ground terminal 25 is disposed in or on the outermost portion of the unit region 10Ua or 10Ub.

In addition, shown in FIG. 3, the ground terminal 25 may be wider and/or have a greater surface area than those of other patterns of the unit region 10U. As also shown in FIG. 3, the ground terminal 25 may partially surround the I/O pads 23 on one side of the I/O pads 23.

Figure 4A:
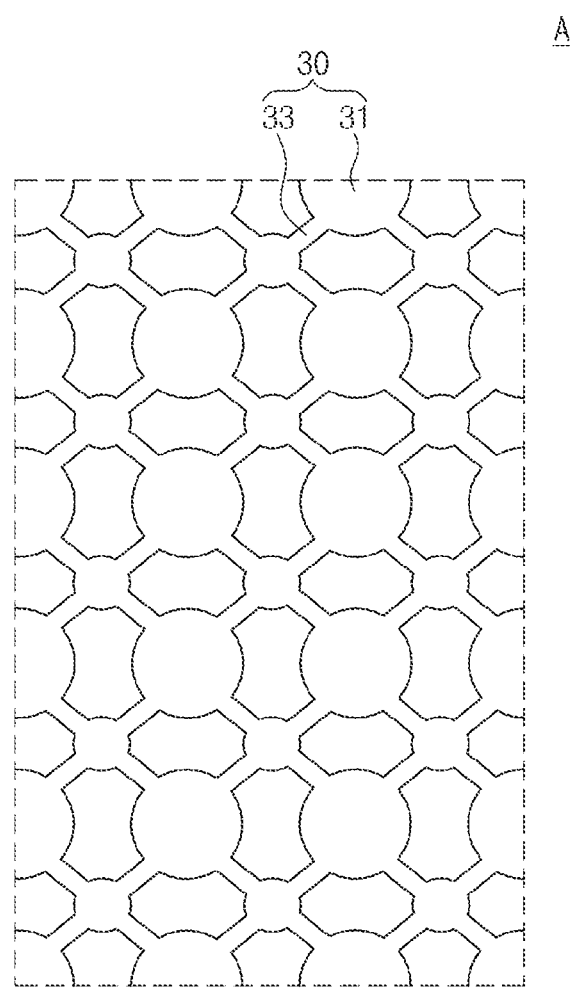
FIGS. 4A, 4B, and 4C are enlarged views of a portion 'A' of FIGS. 1A and 1B according to example embodiments of the inventive concepts.
Figure 4B:
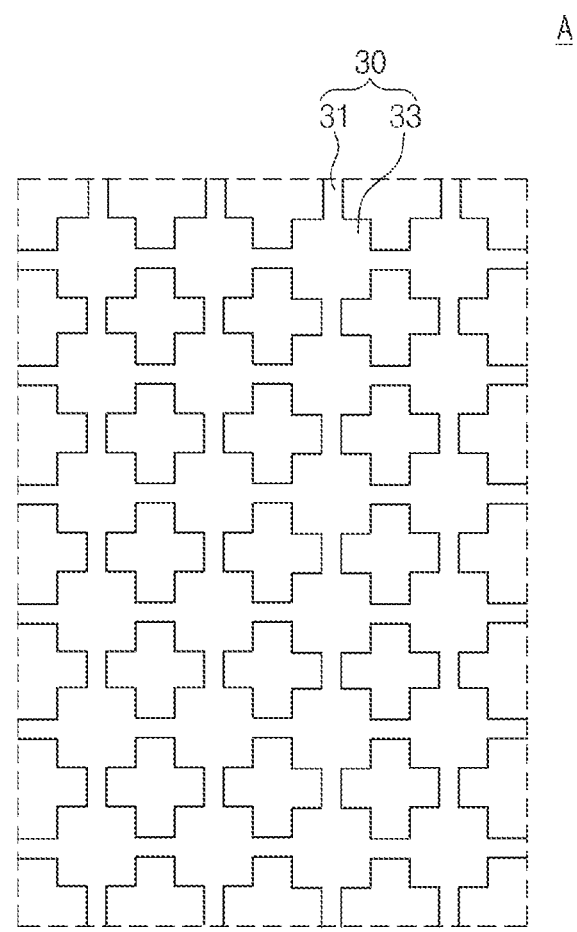
Figure 4C:
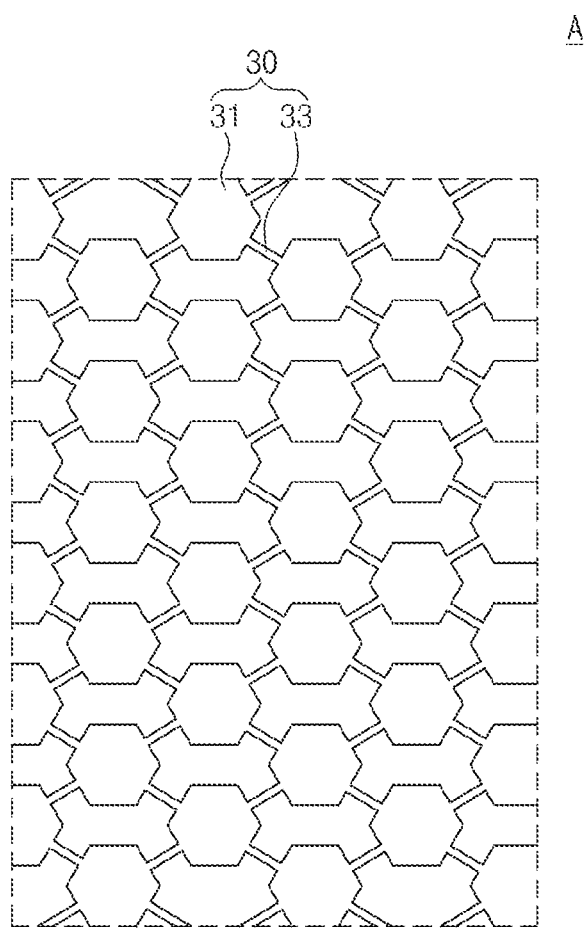

FIGS. 4A, 4B, and 4C are enlarged views illustrating example embodiments of a portion 'A' of the dummy region 10D of the substrate strips 10a and 10b of FIGS. 1A and 1B. In particular, each of these figures illustrates a portion of a dummy structure 30 included in the dummy region 10D.

The dummy structure 30, when viewed from a plan view, may include a plurality of dummy pad portions 31 arranged in two dimensions relative to a surface of the dummy region 10D, and connection portions 33 connecting the dummy pad portions 31. The dummy pad portions 31 may have any of a variety of different shapes. As examples, the dummy pad portions may be circular as in FIG. 4A, or quadrilateral as in FIG. 4B, or polygonal as in FIG. 4C. Also, the dummy pad portions 31 may be arranged in rows and columns to define a regular matrix pattern in which the rows (or columns) are aligned with each other) or an irregular matrix pattern in which the rows (or columns) are offset relative to one another.

In example embodiments, the dummy structure 30 is conductive and may be formed of a metal material. For example, the dummy structure 30 may be formed of at least one of copper, a copper alloy, silver, palladium, platinum, gold, a silver-palladium alloy, or nickel. The dummy structure 30 may improve a strength of the substrate strip 10a or 10b, and may inhibit deformation (e.g., warpage) of the substrate strip 10a or 10b. In addition, the dummy structure 30 may be formed simultaneously with the bonding pads 21, the inner interconnections IC, the I/O pads 23, the power terminal and the ground terminal 25 of the unit region 10Ua or 10Ub of FIGS. 2A and 2B. Also, as described next, the dummy structure 30 may be electrically connected to the ground terminals 25 of the unit regions 10Ua and 10Ub.

Figure 5:
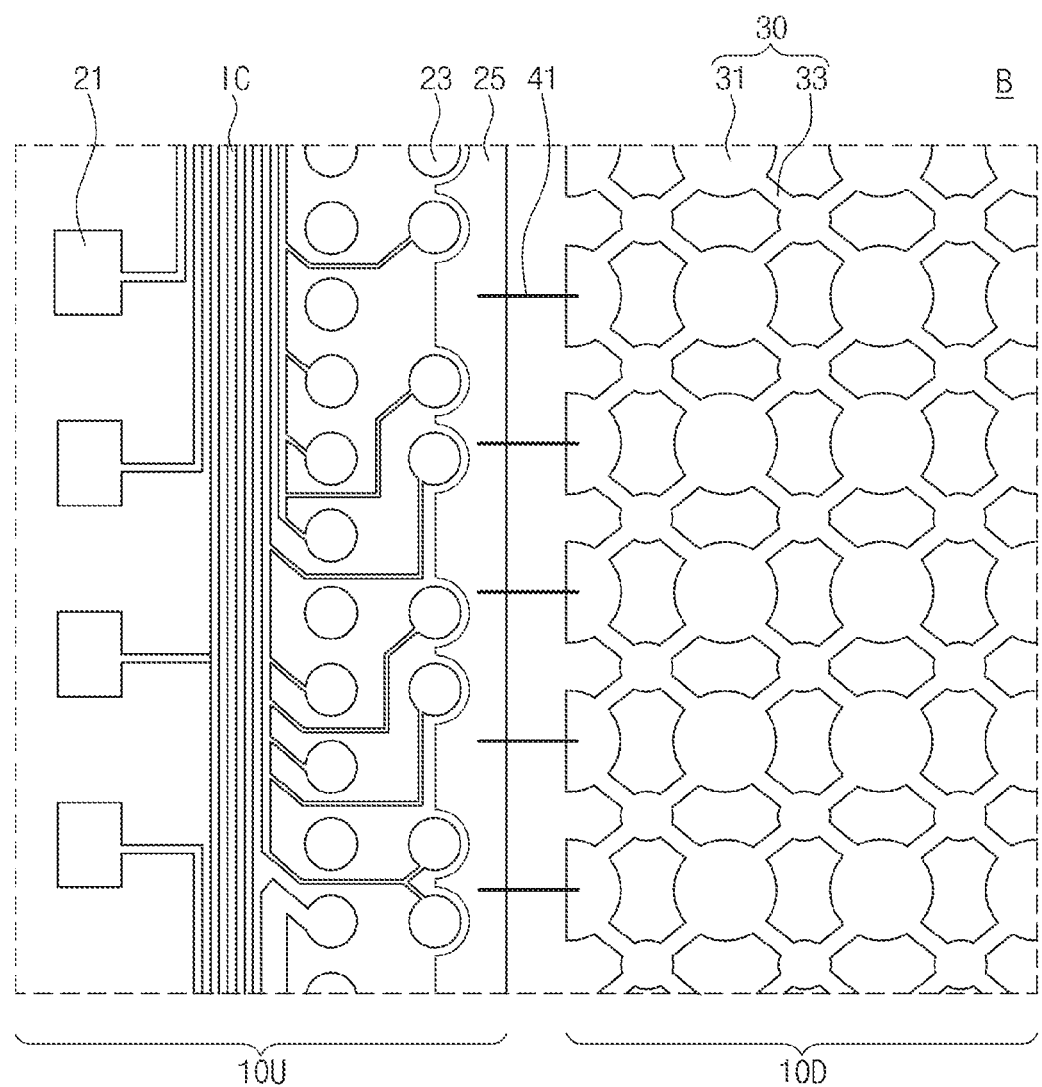
FIG. 5 is an enlarged view of a portion 'B' of FIGS. 1A and 1B according to an embodiment of the inventive concepts.

FIG. 5 is an enlarged view of a portion 'B' of FIGS. 1A and 1B to according to an embodiment of the inventive concepts. In particular, FIG. 5 shows an example of a portion of a unit region 10U and a portion of the dummy region 10D adjacent the unit region 10U.

Referring to FIGS. 1A (or 1B) and 5, first conductive lines (or traces) 41 electrically connect the dummy structure 30 to the ground terminals 25 of the unit regions 10U adjacent to the dummy region 10D. The first conductive lines 41 may be formed using a plating process. The plating process may include an electro-less plating process and an electroplating process. For example, the first conductive lines 41 may be formed of a metal material such as aluminum (Al), copper (Cu), tin (Sn), antimony (Sb), gold (Au), nickel (Ni), or lead (Pb).

Figure 6:
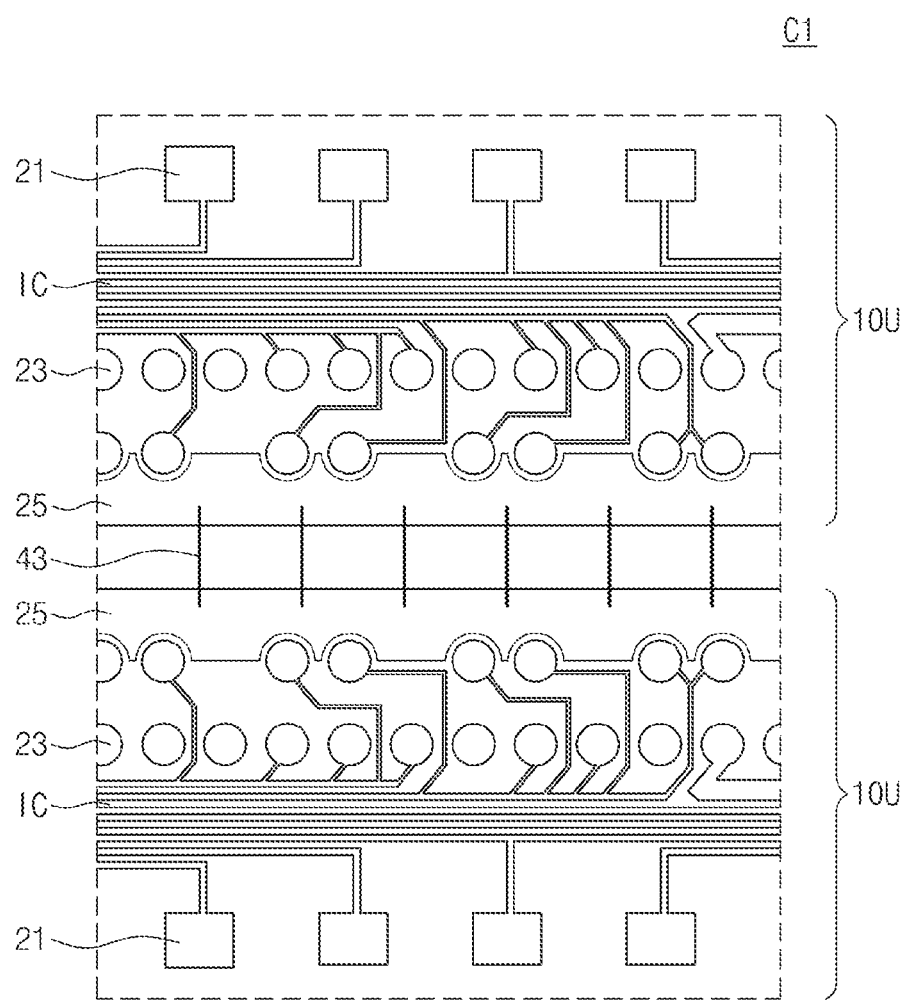
FIG. 6 is an enlarged view of a portion 'C1' of FIG. 1A according to an embodiment of the inventive concepts.

FIG. 6 is an enlarged view of a portion 'C1' of FIG. 1A according to an embodiment of the inventive concepts. In particular, FIG. 6 shows an example of portions of adjacent unit regions 10U.

Referring to FIGS. 1A and 6, the ground terminals 25 of the adjacent unit regions 10U are electrically connected to each other through second conductive lines (or traces) 43. In example embodiments, second conductive lines 43 span in the first direction D1 to connect ground terminals 25 of regions 10U which are adjacent to each other in the first direction D1, and also span in the second direction D2 to connect ground terminals 25 of regions 10U which are adjacent to each other in the second direction D2. The second conductive lines 43 may be formed using a plating process. The plating process may include an electro-less plating process and an electroplating process. For example, the second conductive lines 43 may be formed of a metal material such as aluminum (Al), copper (Cu), tin (Sn), antimony (Sb), gold (Au), nickel (Ni), or lead (Pb).

According to example embodiments, the ground terminals 25 of the unit regions 10U are electrically connected to the dummy structure 30 through the first and second conductive lines 43. In other words, the ground terminals 25 of the unit regions 10U and the dummy structure 30 may be in an equi-potential state.

Figure 7:
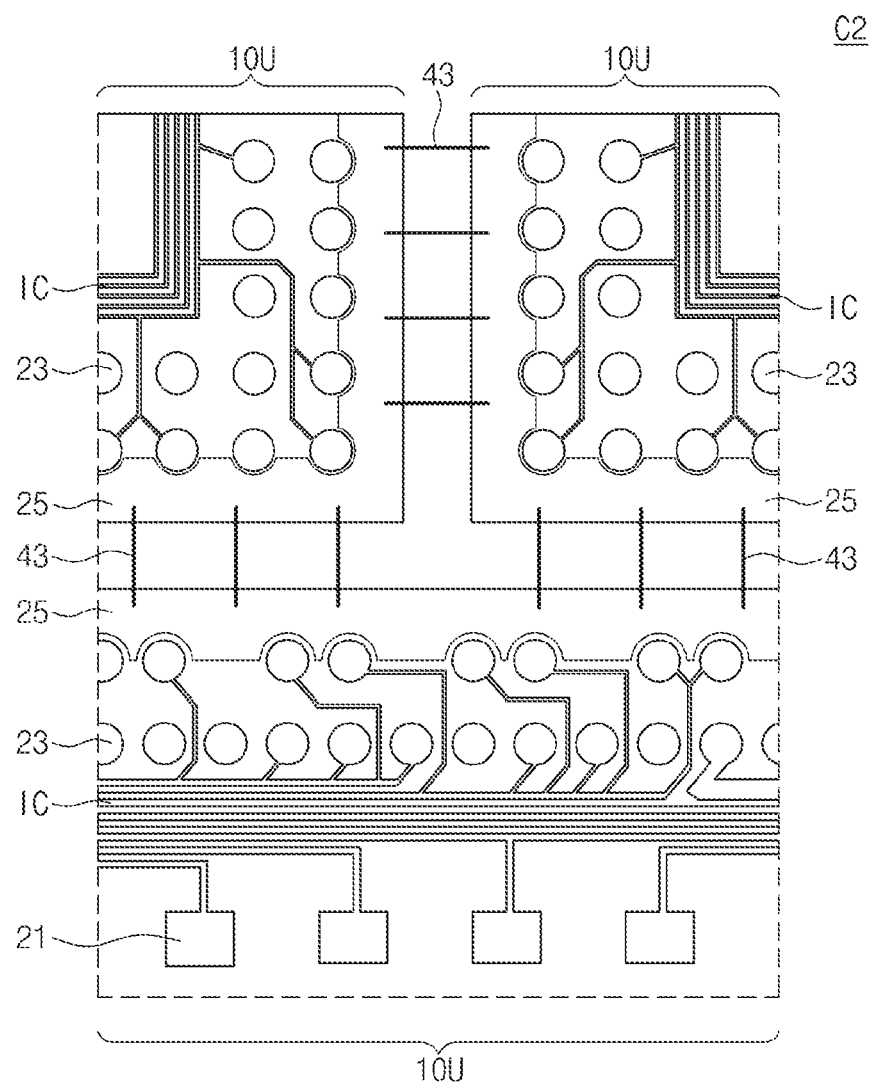
FIG. 7 is an enlarged view of a portion 'C2' of FIG. 1B according to an embodiment of the inventive concepts.

FIG. 7 is an enlarged view of a portion 'C2' of FIG. 1B according to an embodiment of the inventive concepts. In particular, FIG. 7 shows an example of a portion of two adjacent unit regions 10U and a portion of another unit region 10U adjacent the two adjacent the unit regions 10U. Here, the ground terminals 25 of the three adjacent unit regions 10U are connected as shown by the second conductive lines 43 such as those shown and described above in connection with FIG. 6.

Figure 8B:
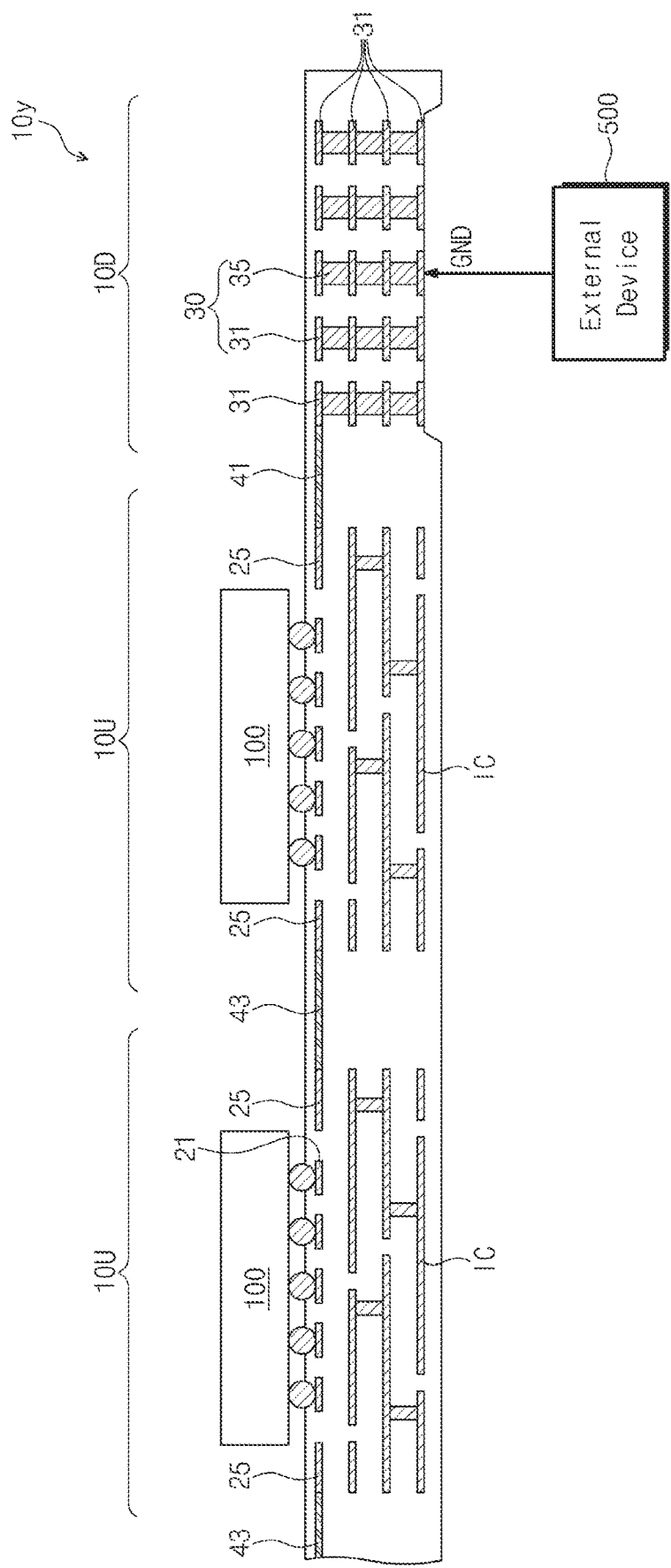

FIGS. 8A, 8B, and 8C are cross-sectional views illustrating portions of substrate strips 10x, 10y and 10z, respectively, according to example embodiments of the inventive concepts. Namely, each of these figures is a cross-sectional view of a portion including a dummy region 10D and two unit regions 10U.

Referring to FIGS. 8A, 8B, and 8C, each of the unit regions 10U may include the bonding pads 21, the inner interconnections IC, and the I/O pads 23, the power terminal, and the ground terminal 25, as described previously with reference to FIGS. 2A and 2B. In the meantime, the dummy region 10D may include the dummy structure 30 including the dummy pad portions 31 and the connection portions 33, as described previously with reference to FIGS. 4A, 4B, and 4C.

In more detail, the substrate strips 10x, 10y and 10z may include a plurality of insulating layers vertically stacked, and the inner interconnections IC may be disposed between the insulating layers of the stack in each of the unit regions 10U. As shown, ground terminal 25 may be disposed in the outermost peripheral portion of each of the unit regions 10U. A semiconductor chip 100 (such as the semiconductor chip 100b of FIG. 2B) may be disposed on a top surface of each of the unit regions 10U.

Also, as represented in FIGS. 8A, 8B and 8C, dummy pad portions 31 and the connection portions (33 in FIGS. 4A, 4B and 4C) of dummy structure 30 may be disposed between the insulating layers in the dummy region 10D. In other words, the dummy pad portions 31 and the connection portions 33 described with reference to FIGS. 4A, 4B, and 4C may be vertically stacked in the substrate strips 10a, 10b and 10c. In addition, the dummy structure 30 may further include conductive vias 35 connecting the dummy pad portions 31 that are vertically aligned over each other. Thus, the dummy pads 31, the connection portions 33 and the conductive vias 35 throughout the dummy region 10D may be electrically connected to each other.

In some embodiments, the insulating layers may include a polymer material (e.g., a thermally cured resin), an epoxy-based resin (e.g., flame retardant 4 (FR-4), bismaleimide triazine (BT), or Ajinomoto build up film (ABF)), or prepreg (PPG). The inner interconnections IC, the I/O pads 23, the power terminal, the ground terminal 25, the dummy pad portions 31, and the connection portions 33 may be formed by performing a plating process using a photoresist pattern as a mask. The plating process may include an electro-less plating process and an electroplating process. The inner interconnections IC, the dummy pad portions 31, and the connection portions 33 may be formed of a metal material such as copper, a copper alloy, silver, palladium, platinum, gold, a silver-palladium alloy, or nickel.

In the substrate strip 10*x* illustrated in FIG. 8A, the ground terminals 25 of the unit regions 10U adjacent to the dummy region 10D are electrically connected to the dummy structure 30 through the first conductive lines 41. Here, the first conductive lines 41 are formed on the top surface of the substrate strip 10*x*, for example by means of a plating process. The ground terminals 25 of the unit regions 10U adjacent to each other are electrically connected to each other through the second conductive lines 43. Here, the second conductive lines 43 are also formed on the top surface of the substrate strip 10*a*, for example by means of a plating process.

In the substrate strip 10*y* illustrated in FIG. 8B, the first conductive lines 41 connecting the ground terminals 25 of the unit regions 10U to the dummy structure 30 are formed below the surface of the substrate strip 10*b* at an interface between insulating layers included in the substrate strip 10*y*. In this example, the first conductive lines 41 are co-planar with the ground terminals 25 and dummy pad portions 31 connected thereto. Likewise, the second conductive lines 43 are formed below the surface of the substrate strip 10*y* at an interface between insulating layers included in the substrate strip 10*a*. In this example, second conductive lines 43 are co-planar with the ground terminals 25 connected thereto.

In the substrate strip 10*z* illustrated in FIG. 8C, each of the unit regions 10U may include a plurality of stacked ground terminals 25, and the stacked ground terminals 25 may be connected to each other through vias. Each ground terminal 25 and dummy pad portion 31 which are disposed at the same level may be connected to each other through first conductive lines 41. In this manner, first conductive lines 41 are vertically stacked in the substrate strip 10*c* respectively connected between the stacked ground terminals 25 and the stacked dummy pad portions 31. Likewise, the ground terminals 25 of the adjacent unit regions 10U which are disposed at the same level may be connected to each other through second conductive lines 43. As such, second conductive lines 43 are vertically stacked in the substrate strip 10*z* and respectively connected between adjacent stacked ground terminals 25.

In each plane of the embodiments of FIGS. 8B and 8C, the first conductive lines 41, the ground terminals 25, and the dummy pad portions 31 may be formed of a contiguous (uninterrupted) conductive trace. Similarly, in each plane of the embodiments of FIGS. 8B and 8C, the second conductive lines 43 and the ground terminals 25 may be formed of a contiguous (uninterrupted) conductive trace.

According to example embodiments, an electrical connection may be me made to the dummy structure 30 the substrate strips 10*x*, 10*y* and 10*z*. This allows a ground voltage to applied to the dummy structure 30 from an external device 500 as represented in FIGS. 8A, 8B and 8C. For example, the dummy pad portions 31 may be exposed at the bottom surface of the substrate strips 10*x*, 10*y* and 10*z*, and the ground voltage may be applied to the exposed dummy pad portions 31. In the manner, the ground voltage will also be applied to the ground terminals 25 of the unit regions 10U through the first and second conductive lines 41 and 43 during a process of manufacturing a semiconductor package.

Figure 9:
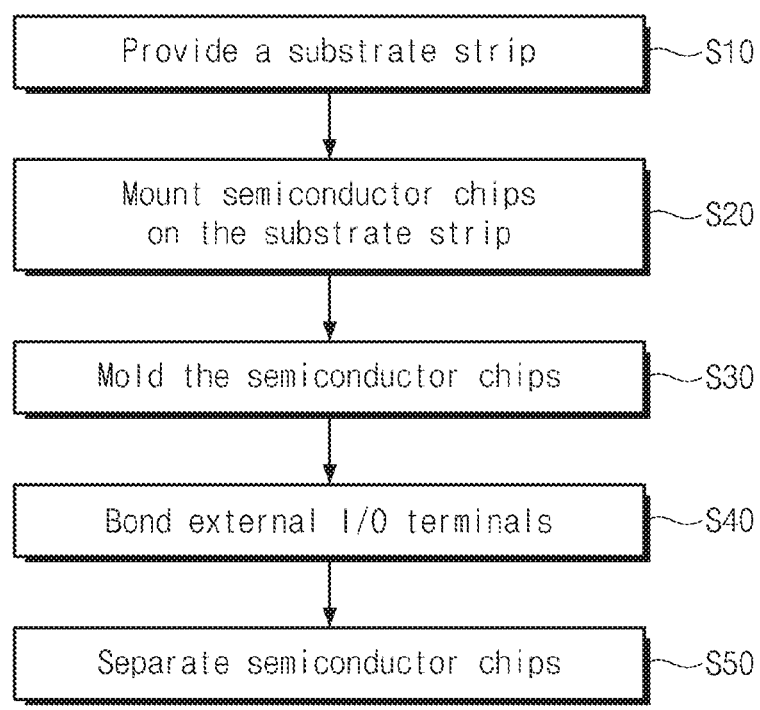
FIG. 9 is a flow chart for reference in describing a method of manufacturing a semiconductor package from a substrate strip according to example embodiments of the inventive concepts.

FIG. 9 is a flow chart for reference in describing a method of manufacturing a semiconductor package from a substrate strip according to example embodiments of the inventive concepts. FIGS. 10 to 13 are cross-sectional views also for reference in describing a method of manufacturing a semiconductor package from a substrate strip according to example embodiments of the inventive concepts. FIG. 14 is an enlarged view of a portion 'E' of FIGS. 10 and 11.

Figure 10:
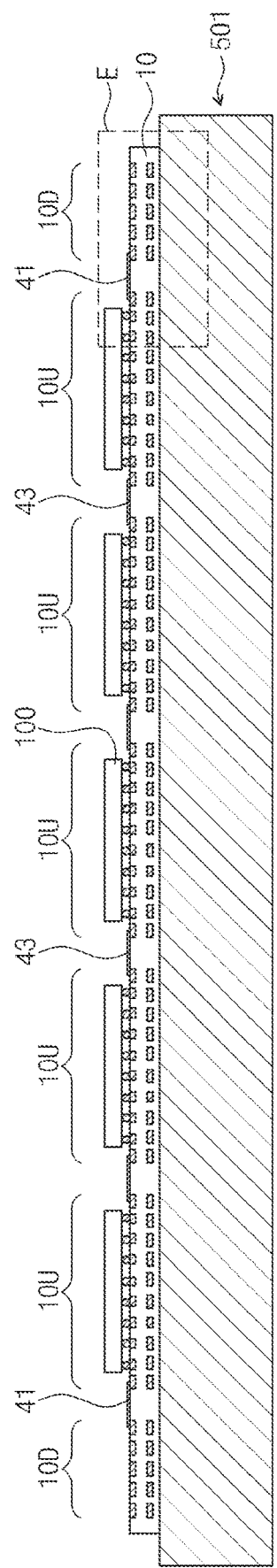
FIGS. 10 to 13 are cross-sectional views for reference in describing a method of manufacturing a semiconductor package from a substrate strip according to example embodiments of the inventive concepts.

Referring to FIGS. 9 and 10, a substrate strip 10 according to example embodiments is provided (S10) and located on a support of a semiconductor package manufacturing apparatus 501. The substrate strip 10 may include a plurality of unit regions 10U and a dummy region 10D, such as the substrate strips 10*a* and 10*b* described previously with reference to FIGS. 1A through 7. In addition, the substrate strip 10 may include the previously described inner interconnections IC, bonding pads 21, I/O pads 23, power terminal, and ground terminal 25 in each of the unit regions 10U, and the previously described dummy structure 30 in the dummy region 10D. A cross-section of the substrate strip 10 may correspond to any of the substrate strips 10*x*, 10*y* and 10*z* described previously in connection with FIGS. 8A, 8B and 8C, respectively.

Next, semiconductor chips 100 are mounted on the unit regions 10U of the substrate strip 10 located on the supporter (S20). As best shown in FIG. 14, the support may include a ground pad 510 that is supplied with a ground voltage. The substrate strip 10 may be located on the support of the semiconductor package manufacturing apparatus 501 such that the dummy structure 30 of the substrate strip 10 is in contact with the ground pad 510 of the support. Thus, the ground voltage may be applied to the ground terminals 25 of the unit regions 10U through the dummy structure 30 and the first and second conductive lines 41 and 43. As a result, protection of the semiconductor chips 100 from electrostatic discharge (ESD) and/or high-current surge is provided during the process of mounting the semiconductor chips 100. The support having the ground pad 510 may correspond to the external device 500 of FIGS. 8A to 8C.

Figure 11:
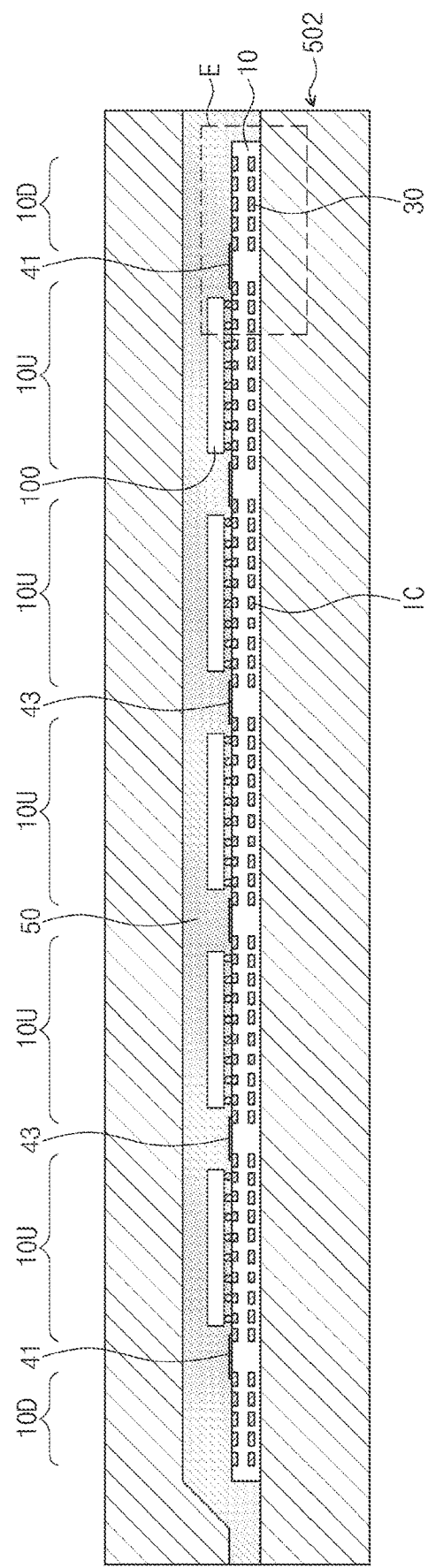

Referring to FIGS. 9 and 11, the substrate strip 10 having the semiconductor chips 100 may be loaded in a semiconductor package molding apparatus 502, and a process of molding the semiconductor chips 100 may be performed (S30).

That is, the substrate strip 10 on which the semiconductor chips 100 are mounted may be loaded in a mold of the molding apparatus 502, and a molding compound may be injected into the mold. The molding compound may, for example, be an epoxy mold compound (EMC). The molding compound may flow over an entirety of the substrate strip 10 to form molding layer 50 that covers the semiconductor chips 100 and files spaces between the substrate strip 10 and the semiconductor chips 100.

As illustrated in FIG. 14, the dummy structure 30 of the substrate strip 10 may be in contact with a ground pad 510 of the molding apparatus 502 during the molding process, to allow for application of a ground voltage to the dummy structure 30. Thus, since the semiconductor chips 100 are electrically connected to the dummy structure 30 through the first and second conductive lines 41 and 43, the semiconductor chips 100 are protected from electrostatic discharge (ESD) and/or high-current surge during the molding process.

Figure 12:
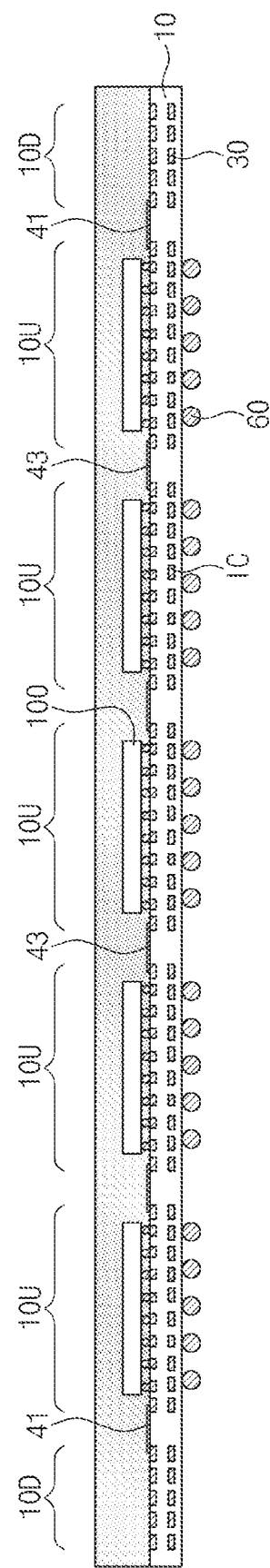

Referring to FIGS. 9 and 12, external I/O terminals 60 are bonded to a bottom surface of the substrate strip 10 (S40).

In particular, the external I/O terminals 60 are bonded to the I/O pads 23 of each of the unit regions 10U. The external I/O terminals 60 may, for example, be solder balls or bumps. The external I/O terminals 60 may be connected to the inner interconnections IC for electrical connection to the semiconductor chips 100. That is, electrical signals provided from an external electronic device may be provided to the semiconductor chips 100 through the external I/O terminals 60 and the inner interconnections IC.

Figure 13:
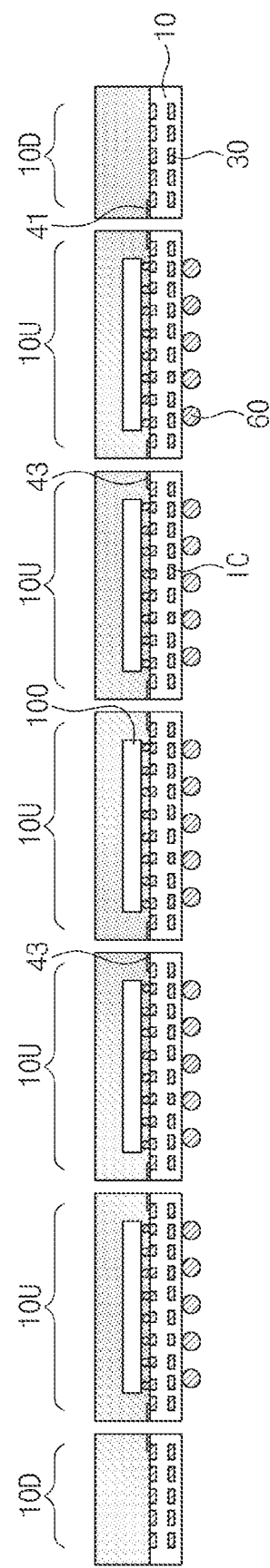
Figure 14:
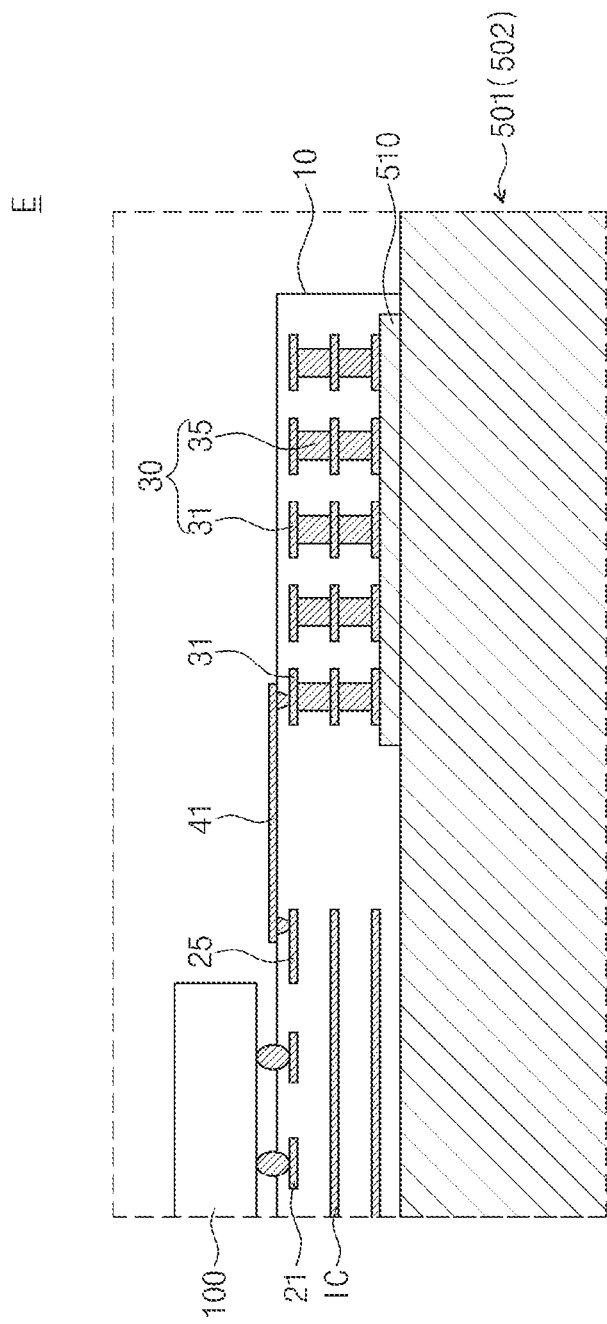
FIG. 14 is an enlarged view of a portion 'E' of FIGS. 10 and 11 according to an embodiment of the inventive concepts.

Referring to FIGS. 9 and 13, a sawing (or cutting) process is performed on the substrate strip 10 to separate the unit regions 10U having the semiconductor chips 100 from each other. In this manner, a single substrate strip 10 is separated into plural semiconductor packages.

In particular, sawing is carried out using a blade along saw lines which extend between the unit regions 10U, and between the unit regions 10U and the dummy region 10D. As such, the blade saws through the molding layer 50 and the substrate strip 10 along the saw lines, including the first conductive lines 41 connecting the dummy structure 30 to the ground terminals 25 and the second conductive lines 43 connecting the ground terminals 25 to each other.

Figure 15:
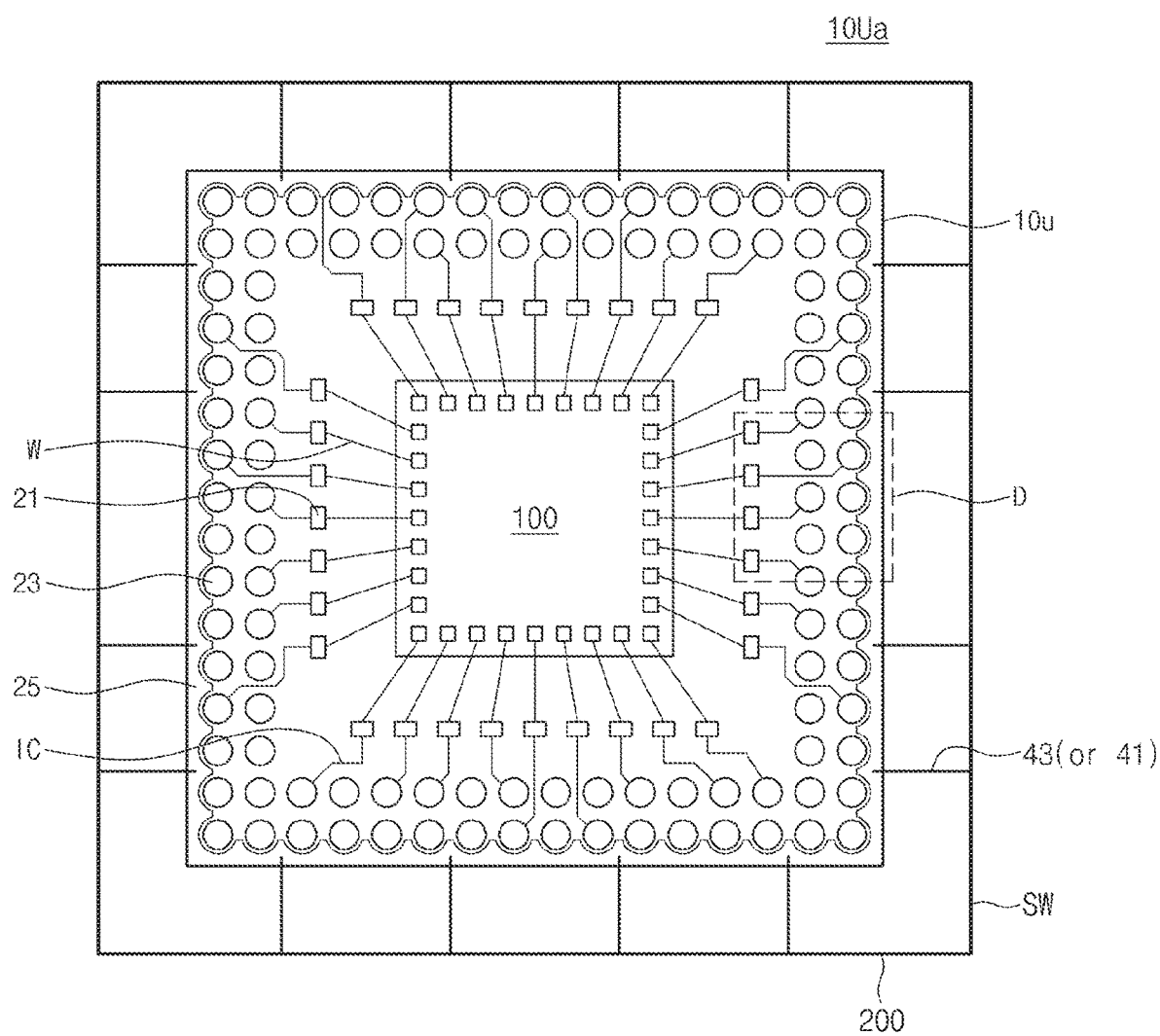
FIG. 15 is a top perspective view of a semiconductor package according to embodiments of the inventive concepts.

FIG. 15 is a perspective plan view of a semiconductor package that has been fabricated from a substrate strip according to embodiments of the inventive concept. In FIG. 15, a unit region 10U is depicted such as the unit region 10Ua of FIG. 2A by way of example only.

As shown, the substrate package includes a conductive plane such as the ground terminal 25 which surrounds a semiconductor chip 100, and a plurality of conductive lines 43 (or 41) each having a proximate end connected to the ground terminal 25 and each having a distal end flush with a side surface SW of an underlying substrate 200. The side surfaces SW correspond to the saw lines discussed previously in connection with FIG. 13. Accordingly, since the conductive lines 43 (or 41) are sawed in the sawing process, the distal ends thereof are flush with the side surface of the underlying substrate.

The ground terminal 25 and conductive lines 43 (or 41) correspond to and may be configured as those described above in connection with earlier embodiments. For example, the conductive lines 43 (or 41) may extend normal the outer edge of the substrate, and like the previous embodiments, the ground terminal 25 may extend around a periphery region of a surface of the substrate. Further, stacks of conductive lines 43 and stacks of ground terminals 25 may be provided as described previously. Further, although not shown, an encapsulate (e.g., 50 of FIG. 11) may cover the upper surface of the substrate and having a side surface flush with the outer edge of the substrate.

Figure 16:
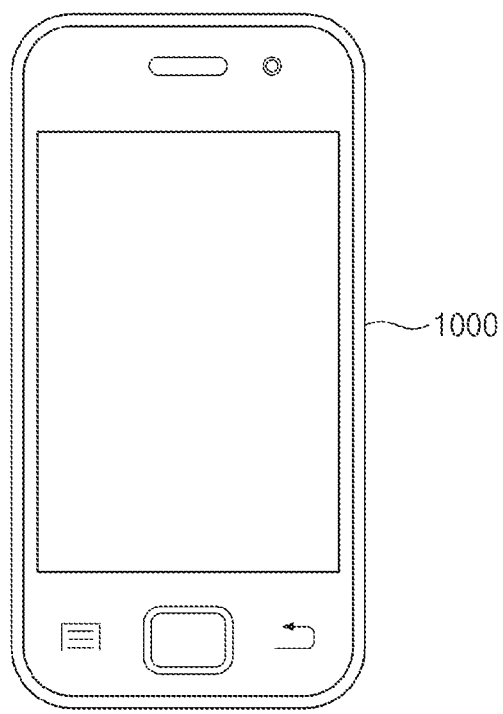
FIG. 16 illustrates an electronic device which may include semiconductor package according to example embodiments of the inventive concepts.

FIG. 16 illustrates an electronic device 1000 which may include a semiconductor package according to example embodiments of the inventive concepts, and FIG. 16 is a schematic block diagram illustrating an electronic device which may include a semiconductor package according to example embodiments of the inventive concepts.

In particular, FIG. 16 illustrates a mobile phone which may be implemented with the semiconductor package according to embodiments of the inventive concepts. In other embodiments, the semiconductor package according to embodiments of the inventive concepts may be applied to a smart phone, a personal digital assistant (PDA), a portable multimedia player (PMP), a digital multimedia broadcast (DMB) device, a global positioning system (GPS) device, a handled gaming console, a portable computer, a web tablet, a wireless phone, a digital music player, a memory card, or other electronic products receiving and/or transmitting information data by wireless.

Figure 17:
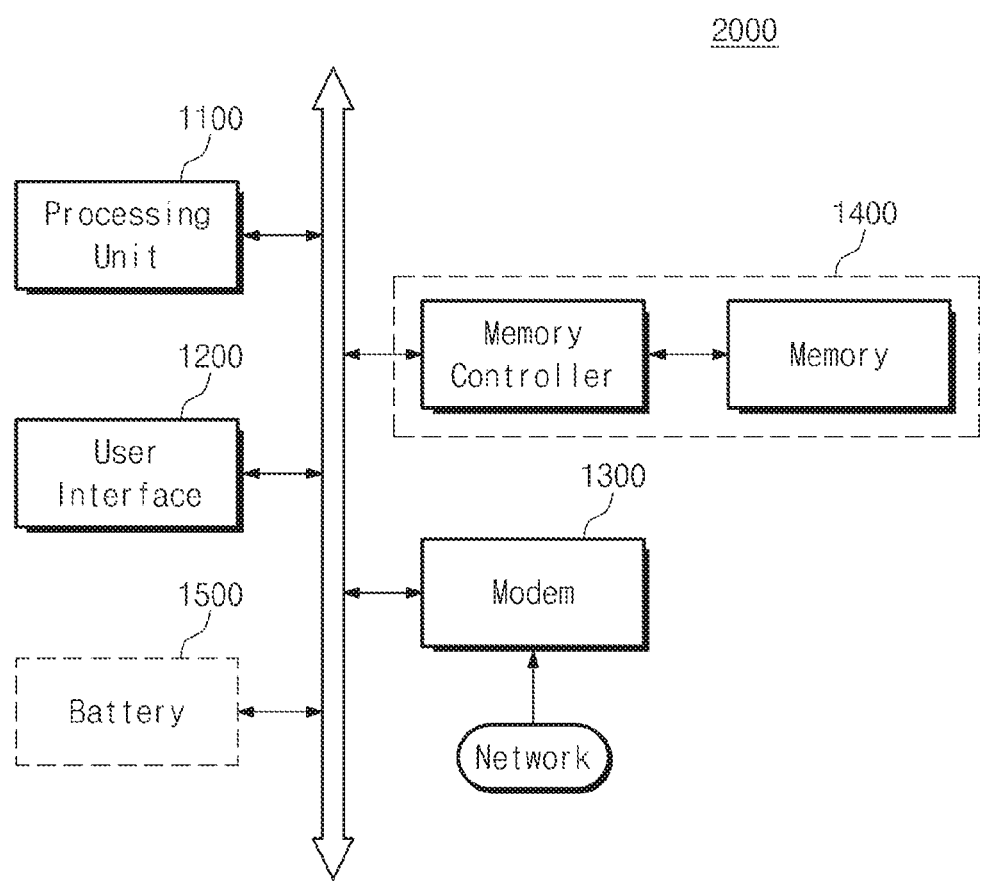
FIG. 17 is a schematic block diagram illustrating an electronic device which may include a semiconductor package according to example embodiments of the inventive concepts.

Referring to FIG. 17, an electronic device 2000 may include a processing unit 1100, a user interface unit 1200, a modem 1300 (e.g., a baseband chipset), and the semiconductor package 1400 according to the embodiments of the inventive concepts.

In the case where the electronic device 2000 is a mobile device, the electronic device 2000 may further include a battery 1500 used to supply an operating voltage to the electronic device 2000. Even though not shown in the drawings, the electronic device 2000 may further include an application chipset and/or a camera image processor (CIS).

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A semiconductor package comprising:
   a substrate having an upper surface, a lower surface, and a plurality of side surfaces;
   a plurality of conductive pads arranged on a central region of the upper surface of the substrate;
   a conductive plane that is contiguous and extends around an entire periphery of the substrate adjacent the plurality of side surfaces of the substrate, when viewed from a plan view;
   a plurality of conductive lines each having a proximate end connected to the conductive plane and a distal end flush with one of the plurality of side surfaces of the substrate;
   a semiconductor chip mounted on the central region of the upper surface of the substrate and electrically connected to the plurality of conductive pads;
   an encapsulate covering the upper surface of the substrate and the semiconductor chip;
   terminal connections located on the lower surface of the substrate and electrically connected to the semiconductor chip,
   wherein the plurality of conductive pads and the conductive plane are located on the upper surface of the substrate, and
   wherein the conductive plane is spaced apart from the plurality of side surfaces of the substrate,
   wherein the conductive plane is included in a stack of conductive planes,
   the stack of conductive planes comprising the conductive plane and a plurality of additional conductive planes vertically spaced from each other,
   wherein the plurality of additional conductive planes are aligned below the upper surface of the substrate, and
   wherein each of the conductive lines is included in one of plural stacks of conductive lines respectively connected to and co-planer with the conductive plane and the additional conductive planes included in the stack of conductive planes; and vias connecting the conductive plane and the additional conductive planes included in the stack of conductive planes to each other.

2. The semiconductor package of claim 1, wherein the plurality of conductive lines are embedded within the substrate below the upper surface of the substrate.

3. The semiconductor package of claim 1, wherein side surfaces of the encapsulate are flush with the plurality of side surfaces of the substrate, respectively.

4. The semiconductor package of claim 1, wherein the proximate ends of the conductive lines are co-planar with the conductive plane and the plurality of additional conductive planes.

5. The semiconductor package of claim 4, wherein the conductive lines are contiguous with the conductive plane and the plurality of additional conductive planes at the proximate ends of the conductive lines.

\* \* \* \* \*